United States Patent
Sun

(10) Patent No.: US 9,142,409 B2
(45) Date of Patent: Sep. 22, 2015

(54) POLYSILICON THIN FILM AND MANUFACTURING METHOD THEREOF, ARRAY SUBSTRATE AND DISPLAY DEVICE

(71) Applicant: BOE Technology Group Co., Ltd., Beijing (CN)

(72) Inventor: Tuo Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 71 days.

(21) Appl. No.: 13/963,112

(22) Filed: Aug. 9, 2013

(65) Prior Publication Data

US 2014/0091305 A1    Apr. 3, 2014

(30) Foreign Application Priority Data

Sep. 29, 2012    (CN) .......................... 2012 1 0375067

(51) Int. Cl.
| | |
|---|---|
| H01L 29/04 | (2006.01) |
| H01L 21/02 | (2006.01) |
| H01L 29/66 | (2006.01) |
| H01L 29/786 | (2006.01) |
| H01L 27/12 | (2006.01) |

(52) U.S. Cl.
CPC ...... *H01L 21/02595* (2013.01); *H01L 27/1277* (2013.01); *H01L 29/6675* (2013.01); *H01L 29/78603* (2013.01)

(58) Field of Classification Search
CPC ..................... H01L 21/02595; H01L 29/6675; H01L 21/1277; H01L 29/78603; H01L 27/1277; H01L 21/02; H01L 31/18

USPC ......... 257/49, 77, E39.008, E51.038, E51.04, 257/E23.074, E21.005, E23.111, 40, 642, 257/288, 401, E29.122, E29.12

See application file for complete search history.

(56) References Cited

U.S. PATENT DOCUMENTS

| | | | | |
|---|---|---|---|---|
| 6,693,257 | B1 * | 2/2004 | Tanaka ..................... | 219/121.76 |
| 8,129,215 | B1 * | 3/2012 | Campbell et al. ............... | 438/97 |
| 8,785,261 | B2 * | 7/2014 | King .............................. | 438/151 |
| 8,860,008 | B2 * | 10/2014 | Lee et al. ........................ | 257/40 |
| 8,866,124 | B2 * | 10/2014 | Maxwell et al. .................. | 257/5 |
| 8,901,536 | B2 * | 12/2014 | Kub ................................ | 257/15 |
| 2002/0102783 | A1 * | 8/2002 | Fujimoto et al. .............. | 438/200 |

(Continued)

FOREIGN PATENT DOCUMENTS

| | | |
|---|---|---|
| CN | 102097461 A | 6/2011 |
| KR | 20050042702 A | 5/2005 |

(Continued)

OTHER PUBLICATIONS

First Office Action issued by State Intellectual Property Office of the People's Republic of China for Chinese Patent Application No. 2012103750674 dated Jul. 1, 2014, 8pgs.

(Continued)

*Primary Examiner* — Yosef Gebreyesus

(57) ABSTRACT

A polysilicon thin film and a manufacturing method thereof, an array substrate and a display device are disclosed. The manufacturing method of the polysilicon thin film comprises the following steps: forming a graphene layer and an amorphous silicon layer which are adjacent; forming polysilicon by way of crystallizing amorphous silicon so as to obtain the polysilicon thin film. The polysilicon thin film manufactured by the method possesses good characteristics.

14 Claims, 2 Drawing Sheets

(56) References Cited

U.S. PATENT DOCUMENTS

| | | | |
|---|---|---|---|
| 2005/0139919 A1 | 6/2005 | Park et al. | |
| 2010/0302337 A1* | 12/2010 | Zhou et al. | 347/200 |
| 2011/0073990 A1* | 3/2011 | Berger et al. | 257/532 |
| 2011/0086756 A1 | 4/2011 | Gao et al. | |
| 2011/0108854 A1 | 5/2011 | Sung | |
| 2011/0114918 A1* | 5/2011 | Lin et al. | 257/24 |
| 2012/0074367 A1* | 3/2012 | Costa et al. | 257/2 |
| 2012/0080658 A1* | 4/2012 | Yang et al. | 257/9 |
| 2012/0205237 A1* | 8/2012 | Jung et al. | 204/192.15 |
| 2012/0270054 A1* | 10/2012 | Hong et al. | 428/408 |
| 2013/0001515 A1* | 1/2013 | Li et al. | 257/24 |
| 2013/0001573 A1* | 1/2013 | Lee et al. | 257/60 |
| 2013/0048951 A1* | 2/2013 | Heo et al. | 257/29 |
| 2013/0101247 A1* | 4/2013 | Cho et al. | 385/1 |
| 2013/0207080 A1* | 8/2013 | Dimitrakopoulos et al. | 257/24 |
| 2014/0077161 A1* | 3/2014 | Duan et al. | 257/29 |

FOREIGN PATENT DOCUMENTS

| | | |
|---|---|---|
| KR | 10-2005-0066592 | 6/2005 |
| KR | 100803867 B1 | 2/2008 |
| KR | 100805155 B1 | 2/2008 |
| KR | 20090057205 A | 6/2009 |

OTHER PUBLICATIONS

English translation of First Office Action issued by State Intellectual Property Office of the People's Republic of China for Chinese Patent Application No. 2012103750674 dated Jul. 1, 2014, 5pgs.

Extended European Search Report for European Patent Application No. 13174324.7 dated Aug. 16, 2013, 9pgs.

Evanoff et al., Nanosilicon-Coated Graphene Granules and Anodes for Li-Ion Batteries, Advanced Energy Materials, 2011, vol. 1, pp. 495-498.

Zhang et al., Silicon/graphene-sheet hybrid film as anode for lithium ion batteries, Electrochemistry Communications 2012, vol. 23, pp. 17-20.

Meng et al., Silicon intercalation of the interface of graphene and Ir(111), Applied Physics Letters, 2012, vol. 100, pp. 083131-1-083131-4.

Mao et al., Silicon layer intercalation of centimeter scale, epitaxially grown monolayer graphene on Ru(0001), 2012, vol. 100, pp. 093101-1-093101-4.

Korean Office Action issued by the Korean Patent Office for Korean Patent Application No. C13P4239-03KR dated Jun. 30, 2014, 4pgs.

English translation of Korean Office Action issued by the Korean Patent Office for Korean Patent Application No. C13P4239-03KR dated Jun. 30, 2014, 3pgs.

Korean Examination Opinion issued by the Korean Patent Office for Korean Patent Application No. 10-2013-0084759 dated Mar. 28, 2015, 4pgs.

English translation of Korean Examination Opinion issued by the Korean Patent Office for Korean Patent Application No. 10-2013-0084759 dated Mar. 28, 2015, 2pgs.

English Abstract of KR20050042702A (listed above under Foreign Patent Documents); 2 pgs.

* cited by examiner

POLYSILICON THIN FILM AND MANUFACTURING METHOD THEREOF, ARRAY SUBSTRATE AND DISPLAY DEVICE

CROSS REFERENCE TO RELATED APPLICATIONS

This application claims priority from Chinese National Application No. 201210375067.4, filed on Sep. 29, 2012, the contents of which are incorporated herein by reference.

TECHNICAL FIELD

Embodiments of the present invention relate to a polysilicon thin film and a manufacturing method thereof, an array substrate and a display device.

BACKGROUND

A polysilicon thin film is a new functional material that has the advantages of both a crystalline silicon material and an amorphous silicon material, and it has the merits of high mobility of a monocrystalline silicon material and the merits of an amorphous silicon material that it can be manufactured in a large area and at low costs simultaneously. Therefore, studying on polysilicon thin film materials draws more and more attentions A polysilicon thin film is composed of many small grains with different sizes and different crystal orientations. The grain size is generally in nanometer level such as tens to hundreds of nanometers, and the size of large grains may reach microns level. A polysilicon thin film with large grains has a relatively high mobility, which is close to the mobility of a bulk material. The polysilicon thin film has been widely used in manufacture of semiconductor devices, such as polysilicon thin film transistors (TFTs) in the display industry, micro-electromechanical systems, integrated circuits, and it may replace the SOI (Silicon on Insulator) material, or the like. In the display industry, especially in products of AMOLED (Active Matrix Organic Light-emitting Device) and TFT-LCD (liquid crystal display), in order to improve the performance of display panels, TFTs are usually used for manufacturing driving circuits of pixel and their peripheral areas. For most of the TFTs, polysilicon thin films are used as active layers, and moreover, driving circuits and display elements are both formed on a transparent glass substrate. In each of these cases, it is required that the polysilicon thin film has better performance. Further, the polysilicon thin film has high photosensitivity in the long-wave band, can effectively absorb visible light, and has the stability under illumination, and moreover, it does not have the light-induced degradation phenomenon of the amorphous silicon material, so that it is an ideal material for solar cells.

There are many methods for manufacturing polysilicon thin films in prior art, which including direct deposition methods and indirect crystallization methods. Direct deposition methods include a chemical vapor deposition method, a liquid phase growth method and a hot wire method, etc. Indirect crystallization methods include an excimer laser annealing (ELA) method, a solid phase crystallization method and a metal induced crystallization method, etc. However, the characteristics of the polysilicon thin films formed by above methods are not good because the polysilicon grains are rather small. Currently, in the production of polysilicon thin films, excimer laser annealing method is used most commonly as a low-temperature fabricating technology of polysilicon thin films. However, excimer laser belongs to a kind of pulsed laser and energy density of each pulse will vary somewhat, and so, it is uneasy to control the excimer laser in energy density, which brings about non-uniformity in sizes of final grains. In turn, this results in the fact that polysilicon thin films are not good in homogeneity. Moreover, the produced polysilicon thin films have relatively poor repeatability and stability, and are hard to be crystallized in a large area in manufacturing. There is still a demand for producing high-performance polysilicon materials.

SUMMARY

According to embodiments of the invention, there are provided a polysilicon thin film and a manufacturing method thereof, an array substrate and a display device. According to the manufacturing method of the present invention, the sizes of grains of polysilicon are larger, uniform, and ordered. Therefore, polysilicon thin film according to the present invention has a good feature such as repeatability, stability, homogeneity.

In an aspect of the invention, there is provided a manufacturing method of a polysilicon thin film, comprising the following steps: (A) forming a graphene layer and an amorphous silicon layer which are adjacent; (B) forming polysilicon by way of crystallizing amorphous silicon, so as to obtain the polysilicon thin film.

For example, the step (A) comprises that forming the amorphous silicon layer on a base layer, and then forming the graphene layer on the amorphous silicon layer.

For example, after the step (B), the method further comprises step (C), in which the graphene layer is removed through an ashing process.

For example, the ashing process in the step (C) ashes the graphene layer by dry etching with oxygen gas.

For example, the step (A) comprises that forming the graphene layer on a base layer, and then forming the amorphous silicon layer on the graphene layer.

For example, the graphene layer formed in the step (A) is a p-type graphene layer.

For example, the graphene layer in the step (A) is of graphene of 2-10 sub-layers, and the thickness of the amorphous silicon layer is in the range of 40 nm to 50 nm.

For example, the method of forming polysilicon by way of crystallizing amorphous silicon is any one of a high temperature furnace method, a pulsed fast thermal sintering method, and an excimer laser annealing method.

For example, the method of forming polysilicon by way of crystallizing amorphous silicon is the excimer laser annealing method, for which, an energy density of an excimer laser is in the range of 50 mJ/cm$^2$ to 500 mJ/cm$^2$, and output frequency of the laser is in the range of 3 Hz to 10 Hz, wherein the excimer laser is one selected from the group consisting of XeCl, ArF, KrF, XeF and other ultraviolet light sources.

In another aspect of the invention, there is further provided a polysilicon thin film that is formed by any manufacturing method stated above.

In still another aspect of the invention, there is further provided an array substrate that includes an array of thin film transistors, an active region of which is formed by the above polysilicon thin film.

In yet still another aspect of the invention, there is further provided a display device that includes the above array substrate.

For example, the display device is a liquid crystal display device or an organic electroluminescent display device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

REFERENCE NUMERALS

Figure 1A:
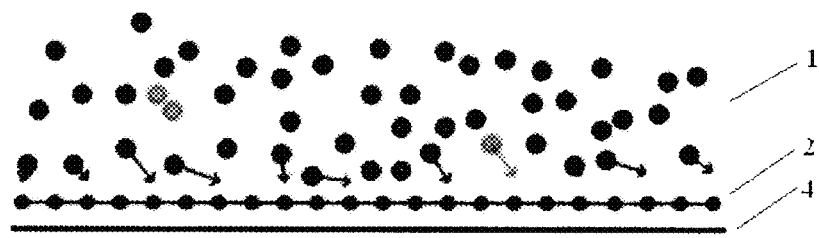
FIGS. 1a-1d are schematic views showing a microprocess in which polysilicon is generated from amorphous silicon by a graphene-assisted excimer laser annealing method in a specific embodiment 3 of the invention.

1—silicon atoms; 2—a graphene layer; 3—polysilicon; 4—a base layer.

DETAILED DESCRIPTION

In order to make the technical solutions of the invention be understood better by those skilled in the art, hereinafter, the invention will be further described in detail in combination with accompanied drawings and specific embodiments.

Unless otherwise defined, the technical terminology or scientific terminology used herein should have the same meaning as commonly understood by one of ordinary skill in the art to which this invention belongs. A term "a," "an," "the," or the like does not indicate limitation in number, but specifies the presence of at least one. A term "comprises," "comprising," "includes," "including", "contains" or the like means that an element or article ahead of this term encompasses element(s) or article(s) listed behind this term and its (their) equivalents, but does not preclude the presence of other elements or articles.

In a first aspect of the invention, there is provided a manufacturing method of a polysilicon thin film, comprising the following steps: (A) forming a graphene layer and an amorphous silicon layer which are adjacent; (B) crystallizing the amorphous silicon layer to form a polysilicon layer, so that the polysilicon thin film is obtained. The polysilicon thin film prepared by the above method has the advantages of no pollution and low defect density; the sizes of grains of polysilicon are larger, uniform, and ordered, and further the surface flatness is better. The polysilicon thin film prepared by the method has good repeatability, stability and homogeneity, and is adaptable to large-area crystallization, and a demand for producing high-performance polysilicon materials can be met.

Embodiment 1-(a)

The present embodiment provides a manufacturing method of a polysilicon thin film, comprising the following steps.

Forming a base layer 4 for a polysilicon thin film.

The base layer 4 for the polysilicon thin film may be fabricated by using an existing or a future method, and the invention is not limited thereto.

At first, there is provided a substrate, which may be a glass substrate, a plastic substrate or other transparent substrate and also may be other opaque substrate, such as a silicon substrate. Next, on the substrate is formed a buffer layer, which is constituted by, such as a barrier layer and a stress buffer layer. The barrier layer may be a silicon nitride layer that is generally formed by means of chemical vapor deposition; while the stress buffer layer is usually a silicon oxide layer, which is generally formed by means of chemical vapor deposition and the film layer structure of which is relatively compact. The substrate and the buffer layer constitute the base layer 4 for the polysilicon thin film. Certainly, the base layer 4 is not limited thereto, and may further contain other functional layer(s) for the polysilicon thin film or other auxiliary layer(s) as well.

Forming a graphene layer 2 on the base layer 4 formed in the former step.

A manufacturing method of stripping may be used for formation of the graphene layer 2. In the manufacturing method of stripping, multilayer graphene is continually grown on a metal substrate by using a chemical vapor deposition method firstly, and then the metal substrate as a sacrificial layer is etched away, so that the multilayer graphene is shifted to a desired location for attachment. The formed graphene layer 2 is preferably of graphene of 2-10 sub-layers. Each sub-layer in the graphene layer has the same thickness as one carbon atom. It is obvious that other method may also be used for fabrication of the graphene layer 2, and the invention is not limited thereto.

Forming an amorphous silicon layer on the graphene layer 2 formed in the former step.

The thickness of the formed amorphous silicon layer may be in the range of 40-50 nm, and the amorphous silicon layer may be formed, for example, by means of plasma enhanced chemical vapor deposition (PECVD). Certainly, the amorphous silicon layer may also be formed by means of low-pressure chemical deposition, physical vapor deposition, sputtering, or the like. Furthermore, a dehydrogenation step may further be conducted on the amorphous silicon layer additionally if it is desired so as to avoid occurrence of a hydrogen decrepitation phenomenon in a subsequent laser process.

After the amorphous silicon layer is formed, then an excimer laser annealing method is conducted, so that the amorphous silicon layer is crystallized to form a polysilicon layer.

A laser beam of excimer laser used for crystallization may adopt ArF (the wavelength is 193 nm, and the pulse width is 17 ns), KrF (the wavelength is 248 nm, and the pulse width is 23 ns), XeCl (the wavelength is 308 nm, and the pulse width is 30 ns), XeF (the wavelength is 351 nm, and the pulse width is 20 ns) or other ultraviolet light source. A sample in which the amorphous silicon layer has been formed on the graphene layer is placed in a vacuum chamber, the substrate temperature is preferably in the range of 200~300° C., and the gas pressure is preferably in the range of $2 \times 10^{-4}$ to $8 \times 10^{-4}$ Pa. Amorphous silicon is melted by the excimer laser, the energy density of which is preferably in the range of 50-500 mJ/cm$^2$, and the output frequency of which is preferably in the range of 3-10 Hz.

FIGS. 1a-1d are schematic views showing a microprocess in which polysilicon is generated from amorphous silicon by a graphene-assisted excimer laser annealing method.

As shown in FIG. 1a, in the course of irradiating with a laser beam, the energy density of the excimer laser irradiating the amorphous silicon layer is controlled so that an amorphous silicon region irradiated by the laser beam is turned into a high-temperature molten state. Thus, the surface energy of silicon atoms 1 is reduced, and at this time, the silicon atoms 1 are arranged out of order.

Figure 1B:

As shown in FIG. 1b, upon annealing, as the temperature lowers, at a boundary location where the silicon atoms 1 in the molten state contact with the graphene layer 2, the uniform arrangement of the graphene layer 2 will induce a crystallization behavior of the silicon atoms 1 that are arranged out of order. Under the action of carbon atoms in the graphene layer 2, silicon atoms 1 that contact with the graphene layer 2 and are arranged out of order will arrange along some certain crystal orientation of the graphene layer 2, and the interplanar spacing of polysilicon 3 that is formed by crystallization of the silicon atoms approximates to the spacing of carbon atoms along some certain crystal orientation of the graphene layer 2 as a template.

Figure 1C:
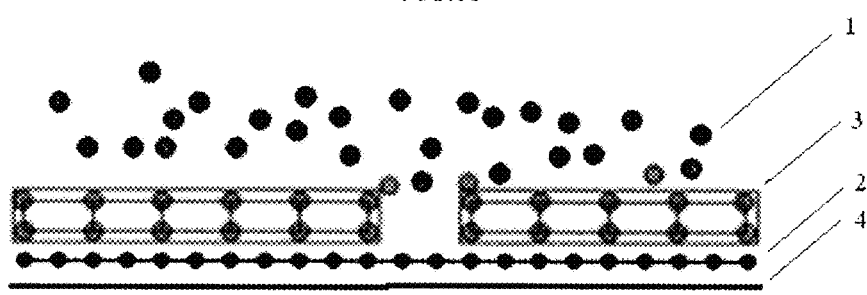

As shown in FIG. 1c, grains of polysilicon 3 in which crystals have been formed will continue to induce crystallization of silicon atoms 1 in the molten state, and successively induce silicon atoms 1 in the molten state in this order.

Figure 1D:
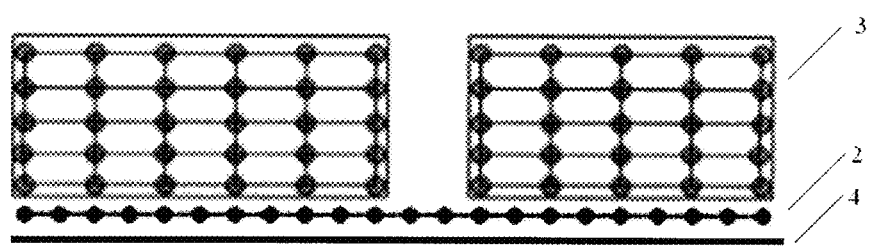

As shown in FIG. 1d, because there is still a small difference between the spacing of adjacent carbon atoms that are arranged orderly in graphene and the interplanar spacing of polysilicon 3 that is formed by inducement, when the difference between the interplanar spacing of polysilicon 3 that is formed by inducement and the interplanar spacing between carbon atoms in graphene accumulates to a certain extent, a piece of polysilicon 3 will be split into two or more grains.

Polysilicon 3 in the polysilicon thin film prepared by the method has advantages of no pollution and low defect density; resultant grains of polysilicon 3 have a uniform size, are arranged in order and larger; and in turn, it has a better surface flatness.

Figure 2A:
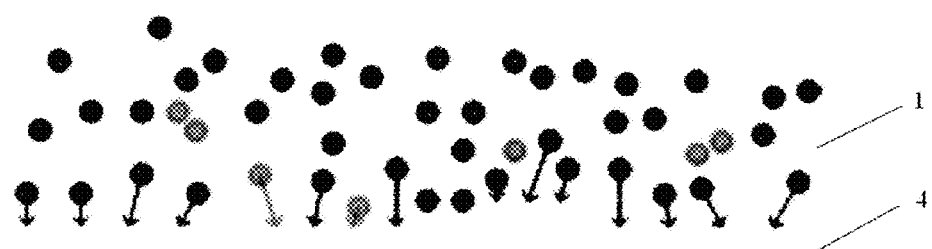
FIGS. 2a-2c are schematic views showing a microprocess in which polysilicon is generated from amorphous silicon by an excimer laser annealing method in a conventional technology.
Figure 2B:
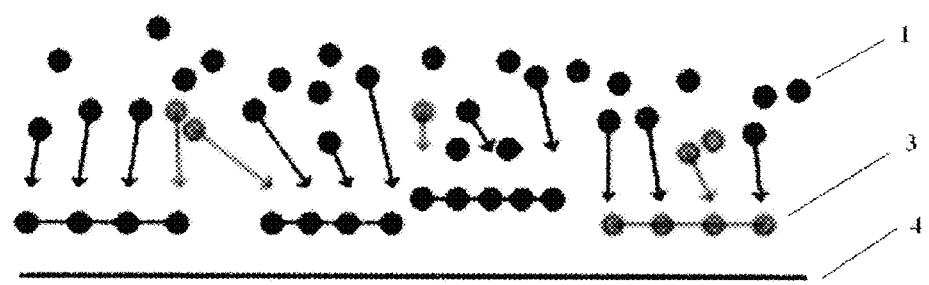
Figure 2C:
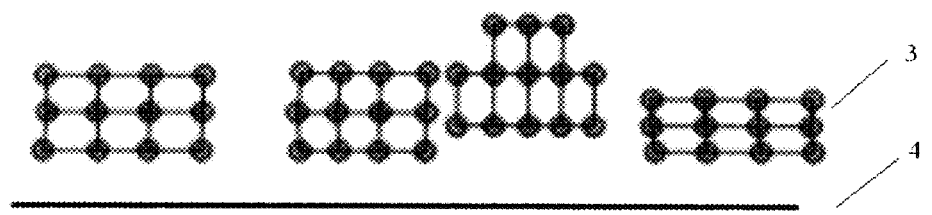

For comparison, FIGS. 2a-2c are schematic views showing a microprocess in which polysilicon is generated by an excimer laser annealing method in a conventional technology.

As shown in FIG. 2a, after irradiation with a laser beam, the energy density of an excimer laser irradiating an amorphous silicon layer is controlled so that an amorphous silicon region irradiated by the laser beam turns into a high-temperature molten state. Thus, the surface energy of silicon atoms 1 is reduced, and at this time, the silicon atoms 1 are arranged out of order.

As shown in FIG. 2b, upon annealing, as the temperature lowers, disorderly silicon atoms 1 will be subjected to crystallization in a disorderly manner in part; as shown in FIG. 2c, under the inducement of polysilicon 3 that is crystallized by a disorderly manner in part, grains are formed in pieces, and at this time, arrangement of grains is also disorderly.

Polysilicon 3 that is generated in the conventional excimer laser annealing method has a relatively high degree of disorder. Although the electron mobility in polysilicon 3 is 10 to 20 times higher than that in amorphous silicon, this disorderly polysilicon 3 leads to a larger fluctuation of a potential field within grains, which is unhelpful for further raising of the electron mobility.

The directionally arranged polysilicon 3 that is formed by the method according to the specific embodiment 1-(a) of the invention can overcome the above drawbacks.

Embodiment 1-(b)

Steps (A) to (C) of the embodiment are the same as the steps (A) to (C) of Embodiment 1-(a). The method of forming a polysilicon layer by way of crystallizing an amorphous silicon layer may also be a high-temperature furnace method. Namely, amorphous silicon is heated to over 600° C. to melt within a high-temperature furnace in an inert atmosphere (such as Ar, $N_2$, etc.), and then the temperature starts to change for annealing, so that silicon atoms 1 are crystallized to form polysilicon 3 under the inducement of graphene, and a polysilicon thin film is obtained.

Embodiment 1-(c)

Steps (A) to (C) of the embodiment are the same as the steps (A) to (C) of Embodiment 1-(a). This embodiment uses a pulsed fast thermal sintering method to melt amorphous silicon, so that silicon atoms 1 are subjected to crystallization to form polysilicon 3 under the inducement of graphene.

In accordance with the manufacturing method in the above embodiments, graphene may be contained in the polysilicon thin film that is obtained finally after fabrication. Graphene is a two-dimensional mesh crystal consisting of a single layer of carbon atoms. Monolayer graphene is a stable material, in which carbon atoms are arranged in good order in accordance with a hexagonal lattice, and because the structure is similar to the structure of a benzene ring and very stable, rearrangement of carbon atoms can be avoided. Graphene is a semiconductor without energy gap, and has carrier mobility that is 10 times higher than that of silicon and effective mass of zero, and moreover, graphene layer 2 is of graphene of only 2-10 sub-layers, so almost no impact is made on the performance of the polysilicon thin film.

During manufacture of the polysilicon thin film, polysilicon 3 that is formed by the process of crystallization of amorphous silicon is usually a p-type semiconductor, so graphene is also a p-type semiconductor preferably. As such, although the amount of graphene is very few, its functionality as the semiconductor matches polysilicon, and graphene has no obvious effect on the finally resultant polysilicon thin film. Moreover, p-type graphene as a part of the polysilicon thin film also can improve the electron mobility of the whole polysilicon thin film.

As shown in table 1, the grain size of the polysilicon 3 in the polysilicon thin film that is made by the above methods is in the range of 100 nm to 300 nm, the electron mobility is in the range of 100 $cm^2 \cdot V^{-1} \cdot s^{-1}$ to 300 $cm^2 \cdot V^{-1} \cdot s^{-1}$. Moreover, the speed of carriers inside the polysilicon thin film is increased greatly, and the device's performance of a polysilicon thin film transistor is promoted.

The polysilicon thin film made by the above method can be applied to active regions of thin film transistors, and has good electron mobility and element's characteristics in a state of current being turned off. These thin film transistors can be used for driving structures in liquid crystal display devices or organic electroluminescent display devices.

Of course, if the polysilicon thin film made by the above method is to be used as an active region of a thin film transistor, steps of forming other structures can be further included, such as, a step of forming source/drain electrodes through a patterning process, a step of forming the polysilicon thin film into the active region through a patterning process, etc. The specific examples of these steps are various, and may be those known by the skilled in the art or to be developed in the future, and the present invention is not limited thereto. In addition, the polysilicon thin film formed by the invention is applicable to other field as well, such as a polysilicon thin film used in a solar cell, etc.

Embodiment 2

This embodiment provides a manufacturing method of a polysilicon thin film, comprising the following steps.

A base layer is fabricated by such a method as the manufacturing method of the base layer in Embodiment 1.

An amorphous silicon layer, the thickness of which is preferably in the range of 40-50 nm, is formed on the base layer, and a graphene layer that has a thickness of 2-10 sublayers preferably is formed on the amorphous silicon layer.

The forming method of the amorphous silicon layer and the forming method of the graphene layer may be the same as those in Embodiment 1.

Amorphous silicon is crystallized to form polysilicon by an excimer laser annealing method, so that the polysilicon thin film is obtained.

The crystallizing method employed in the step may be the same as that in Embodiment 1. Graphene crystals can be produced on a large scale, and quality of the crystals is very high. Because the thickness of graphene fabricated during manufacture of the polysilicon thin film is merely 2-10 sublayers of graphene, and transmittance of such thin-layered graphene to light is very high (more than 95%), no effect will be brought on the excimer laser annealing method.

The graphene layer is removed through an aching process, in which the graphene layer is ashed by dry etching with oxygen gas.

When the graphene layer is of an n-type semiconductor or a conductor, it does not match the p-type semiconductor silicon that is formed by crystallization of amorphous silicon, and thus preferably, the graphene layer can be removed. As the graphene layer consists of only one layer or several layers of carbon atoms, graphene can be fully removed only with an ashing process that is the lightest in degree. Of course, when the graphene layer is of a p-type semiconductor, with consideration that the graphene layer still has a certain difference with the polysilicon layer, it is preferable that an ashing method may be used to remove it. For example, the ashing process is that, the graphene layer is removed by dry etching with oxygen gas. Regarding the dry etching process with oxygen gas, etching of the graphene layer is achieved by means of adjusting the flow of oxygen gas within a plasma etching machine and the total etching time, and meanwhile an object that the polysilicon layer is not damaged is obtained.

Certainly, in manufacturing methods of the polysilicon thin film, it may also be included that a graphene layer is formed on a base layer, and then an amorphous silicon layer is formed on the graphene layer, and then a graphene layer is also possibly formed on the amorphous silicon layer.

In the present embodiment, there are three examples (see table 1). A comparative example 1 is also given in the table 1. The method in the embodiment is used for manufacture of polysilicon thin films by examples 1-3, and a polysilicon thin film of the comparative example 1 is manufactured by using an existing method, and then grain size and electron mobility of resultant polysilicon thin films are examined. Substrates that are used in various examples and the comparative example each are glass substrates, and on each of the glass substrates, a barrier layer of silicon nitride and a stress buffer layer of silicon oxide are formed by way of chemical vapor deposition. The methods for forming the polysilicon thin films are an excimer laser annealing method, and the difference between them only lies in the thickness of the graphene layer 2, the thickness of the polysilicon layer, the layer that is deposited on the base layer 4 firstly, whether or not the graphene layer is ashed, the parameters of the excimer laser annealing, etc. For example, it is possible that the graphene layer 2 is deposited on the base layer 4 firstly, or the amorphous layer is deposited on the base layer 4 firstly. Details are shown in the table 1 below.

TABLE 1

Manufacturing parameters and results of performance test for polysilicon thin films of the comparative example 1 and examples 1 to 3

|  | Example 1 | Example 2 | Example 3 | Comparative Example 1 |
| --- | --- | --- | --- | --- |
| Thickness of graphene layer (layer number of graphene) | 6 | 10 | 2 | no |
| Thickness of polysilicon layer (nm) | 40 | 45 | 50 | 50 |
| Layer deposited on base layer firstly | Graphene layer | a-Si layer | a-Si layer | a-Si layer |
| Ashing or not | No | No | Yes | No |
| Type of laser | ArF | XeCl | KrF | KrF |
| Pressure (Pa) | $2 \times 10^{-4}$ | $8 \times 10^{-4}$ | $5 \times 10^{-4}$ | $5 \times 10^{-4}$ |
| Energy density of laser (mJ/cm$^2$) | 50 | 250 | 500 | 500 |
| Frequency of laser (Hz) | 3 | 10 | 7 | 7 |
| Average grain size (nm) | 200 | 100 | 300 | 50 |
| Electron mobility (cm$^2 \cdot V^{-1} \cdot s^{-1}$) | 190 | 130 | 300 | 70 |

In another aspect of the invention, there is provided a polysilicon thin film manufactured by examples 1 to 3, which can not only be used for manufacture of thin film transistors, but also can be used for fabrication of solar cell materials. Further, it can be widely used in manufacture of other semiconductor devices.

In another aspect of the invention, there is provided an array substrate that includes an array of thin film transistors, and an active layer for the array of thin film transistors is formed of the polysilicon thin film fabricated by any one of methods in examples 1 to 3. The array of thin film transistors corresponds to, such as, a pixel array, and the thin film transistors serve as switching elements of pixel units.

According to the invention, there is further provided a display device that includes the above array substrate. For example, the display device is a liquid crystal display device or an organic electroluminescent display device.

It can be understood that, the foregoing embodiments are merely exemplary embodiments used to explain the principle of the invention, but the invention is not limited thereto.

What is claimed is:

1. A manufacturing method of a polysilicon thin film, comprising the following steps:
   (A) forming a graphene layer and an amorphous silicon layer which are adjacent, wherein the graphene layer is a p-type graphene layer;
   (B) forming polysilicon by way of crystallizing amorphous silicon with the p-type graphene layer so as to obtain the polysilicon thin film.

2. The manufacturing method of the polysilicon thin film of claim 1, wherein, the step (A) comprises:
forming the amorphous silicon layer on a base layer, and then forming the graphene layer on the amorphous silicon layer.

3. The manufacturing method of the polysilicon thin film of claim 2, further comprising a step (C) following the step (B):
removing the graphene layer through an ashing process.

4. The manufacturing method of the polysilicon thin film of claim 3, wherein the ashing process in the step (C) ashes the graphene layer by dry etching with oxygen gas.

5. The manufacturing method of the polysilicon thin film of claim 2, wherein the graphene layer formed in the step (A) is a p-type graphene layer.

6. The manufacturing method of the polysilicon thin film of claim 2, wherein the graphene layer in the step (A) is of graphene of 2-10 sub-layers, and a thickness of the amorphous silicon layer is in the range of 40 nm to 50 nm.

7. The manufacturing method of the polysilicon thin film of claim 1, wherein, the step (A) comprises:
forming the graphene layer on a base layer, and then forming the amorphous silicon layer on the graphene layer.

8. The manufacturing method of the polysilicon thin film of claim 7, wherein the graphene layer formed in the step (A) is a p-type graphene layer.

9. The manufacturing method of the polysilicon thin film of claim 7, wherein the graphene layer in the step (A) is of graphene of 2-10 sub-layers, and a thickness of the amorphous silicon layer is in the range of 40 nm to 50 nm.

10. The manufacturing method of the polysilicon thin film of claim 1, wherein the graphene layer in the step (A) is of graphene of 2-10 sub-layers, and a thickness of the amorphous silicon layer is in the range of 40 nm to 50 nm.

11. The manufacturing method of the polysilicon thin film of claim 1, wherein the method of forming polysilicon by way of crystallizing amorphous silicon in the step (B) is any one of a high temperature furnace method, a pulsed fast thermal sintering method, and an excimer laser annealing method.

12. The manufacturing method of the polysilicon thin film of claim 11, wherein the method of forming polysilicon by way of crystallizing amorphous silicon in the step (B) is the excimer laser annealing method, for which, an energy density of an excimer laser is in the range of 50 mJ/cm$^2$ to 500 mJ/cm$^2$, and an output frequency of the laser is in the range of 3 Hz to 10 Hz.

13. A polysilicon thin film formed by the method of claim 1.

14. An array substrate, comprising an array of thin film transistors, an active layer of which is formed by the polysilicon thin film of claim 13.

* * * * *